US012334153B2

(12) United States Patent
Muchherla et al.

(10) Patent No.: US 12,334,153 B2
(45) Date of Patent: Jun. 17, 2025

(54) ADAPTIVE PRE-READ MANAGEMENT IN MULTI-PASS PROGRAMMING

(71) Applicant: Micron Technology, Inc., Boise, ID (US)

(72) Inventors: Kishore Kumar Muchherla, Fremont, CA (US); Huai-Yuan Tseng, San Ramon, CA (US); Akira Goda, Tokyo (JP); Dung V. Nguyen, San Jose, CA (US); Giovanni Maria Paolucci, Milan (IT); James Fitzpatrick, Laguna Niguel, CA (US); Eric N. Lee, San Jose, CA (US); Dave Scott Ebsen, Minnetonka, MN (US); Tomoharu Tanaka, Kanagawa (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 253 days.

(21) Appl. No.: 17/941,831

(22) Filed: Sep. 9, 2022

(65) Prior Publication Data

US 2024/0087651 A1 Mar. 14, 2024

(51) Int. Cl.
*G11C 16/10* (2006.01)
*G11C 16/26* (2006.01)
*G11C 16/32* (2006.01)

(52) U.S. Cl.
CPC ........... *G11C 16/102* (2013.01); *G11C 16/26* (2013.01); *G11C 16/32* (2013.01)

(58) Field of Classification Search
None
See application file for complete search history.

(56) References Cited

U.S. PATENT DOCUMENTS

| | | | |
|---|---|---|---|
| 2002/0126531 A1* | 9/2002 | Hosono | G11C 16/26 365/185.17 |
| 2017/0255403 A1* | 9/2017 | Sharon | G06F 3/064 |
| 2019/0043596 A1* | 2/2019 | Madraswala | G11C 7/04 |

* cited by examiner

Primary Examiner — J. H. Hur
(74) Attorney, Agent, or Firm — NICHOLSON DE VOS WEBSTER & ELLIOTT LLP

(57) ABSTRACT

Exemplary methods, apparatuses, and systems include an adaptive pre-read manager for controlling pre-reads of the memory device. The adaptive pre-read manager receives a first set of data bits for programming to memory. The adaptive pre-read manager performing a first pass of programming including a first subset of data bits from the set of data bits. The adaptive pre-read manager compares a set of threshold operating differences to a set of differences between multiple operating conditions during the first pass of programming and current operating conditions. The adaptive pre-read manager performs an internal pre-read of the programmed first subset of data bits. The adaptive pre-read manager performs a second pass of programming using the internal pre-read and a second subset of data bits from the first set of data bits.

20 Claims, 4 Drawing Sheets

ADAPTIVE PRE-READ MANAGEMENT IN MULTI-PASS PROGRAMMING

TECHNICAL FIELD

The present disclosure generally relates to writing data to a memory device, and more specifically, relates to adaptive pre-read management in the multi-pass programming of the memory device.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
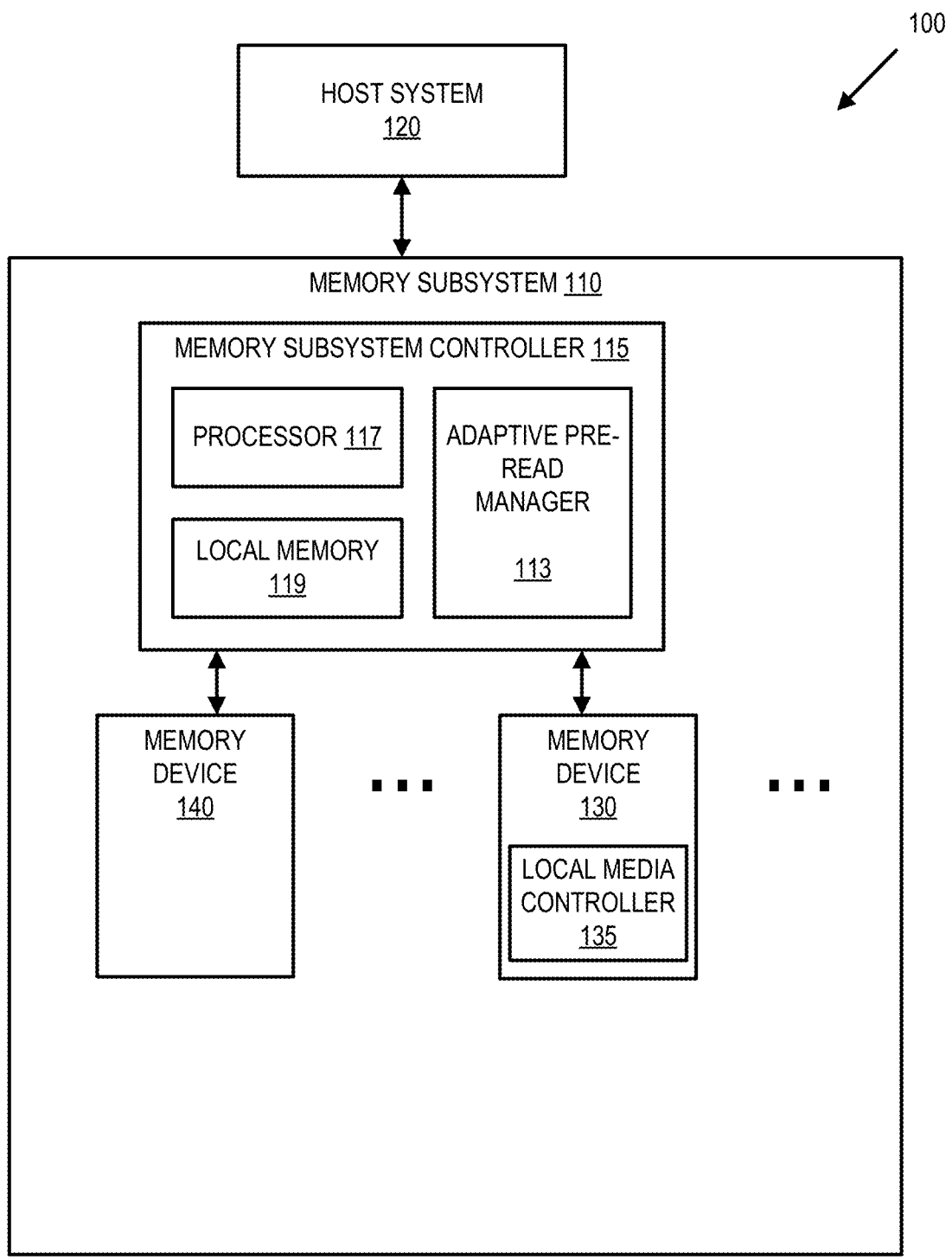
FIG. 1 illustrates an example computing system that includes a memory subsystem in accordance with some embodiments of the present disclosure.

Aspects of the present disclosure are directed to adaptive pre-read management in the multi-pass programming of a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Using quad-level cells improves memory storage but often results in large buffer requirements to buffer data bits such as with 16-16 two-pass programming. In 16-16 two-pass programming, the first pass includes coarse data programming and the second pass includes fine data programming. For example, coarse data programming programs QLC's to 16 threshold voltage (Vt) states (representing the 16 different combinations of values for 4 bits) but leaves the data in an unreadable state. To prevent data loss and otherwise provide access to the data, the corresponding data is also stored in a buffer until the second pass of fine data programming is complete, which leaves the data in a readable 16 Vt state. In some approaches, a portion of these bits could be programmed in a first pass such as by using 8-16 or 4-16 two-pass programming that writes a subset of the bits and uses a lower number of threshold states (8 Vt or 4 Vt) in the first pass.

These multi-pass programming approaches, however, can result in an increase in errors due to cell-to-cell coupling and corresponding bit errors following the first pass of programming. A memory subsystem can mitigate errors in the first pass of programming by reading the first programming pass data (a pre-read), decoding the data using an error correction algorithm, and performing the second pass of programming using the corrected first programming pass data in addition to the second programming pass data. Reading the data from a memory device into a memory subsystem controller, also referred to as an external pre-read because the memory subsystem controller is external to the memory device, provides strong error correction. This level of error correction can be excessive for the number of bit errors following the first pass of programming in some of the memory while consuming memory subsystem resources, such as the decoder and memory interface/bus. Each memory device has a limited capability of reading and correcting errors internally (i.e., an internal pre-read). Internal pre-reads are insufficient for correcting bit errors above a given threshold and, therefore, cannot be used exclusively for a pre-read of data before a subsequent programming pass.

Aspects of the present disclosure address the above and other deficiencies by adaptively performing internal or external pre-reads of the memory. Using a combination of measured operating conditions and threshold settings, an internal pre-read or external pre-read is selected. Selectively performing internal pre-reads reduces the consumption of memory subsystem resources, such as the memory interface and the error correction component(s), such as a low-density parity check decoder. This improves the efficiency and power consumption of the memory subsystem.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package (e.g., not external to the memory device 130). An example of a managed memory device is a managed NAND (MNAND) device.

The memory subsystem 110 includes an adaptive pre-read manager 113 that can measure various operating conditions of the memory system and select an internal pre-read or external pre-read in multi-pass programming. In some embodiments, the controller 115 includes at least a portion of the adaptive pre-read manager 113. For example, the controller 115 can include a processor 117 (processing device) configured to execute instructions stored in local memory 119 for performing the operations described herein. In some embodiments, an adaptive pre-read manager 113 is part of the host system 120, an application, or an operating system.

The adaptive pre-read manager 113 is configured to monitor operating conditions of the memory subsystem and select a pre-read based on the operating conditions. In an embodiment, the adaptive pre-read manager 113 monitors an operating time, a temperature, and a read count of the memory subsystem. The operating time is initialized during a power-up cycle of the memory subsystem and is measured as a time interval from the power-up cycle, such as by a clock, a counter, or a time keeping function. The temperature of the memory subsystem is measured by a temperature sensor or another component of the memory subsystem 110. The read count is measured by counting a number of memory access commands that correspond to performing a read from the memory device 130. The adaptive pre-read manager 113 compares a set of predefined threshold operating differences to a difference between the set of operating conditions during a first pass of programming and a set of current operating conditions. Using the result of the comparison, the adaptive pre-read manager 113 selects a pre-read using the comparisons to corresponding thresholds.

In some embodiments, the adaptive pre-read manager 113 assigns a priority to various operating conditions depending on an influence on bit error rate. For example, a power-on cycle and a time elapsed from the power-on cycle can be assigned greater priority than a write temperature and a read counter that can be assigned a lesser priority. Further details with regards to the operations of the adaptive pre-read manager 113 are described below.

Figure 2:
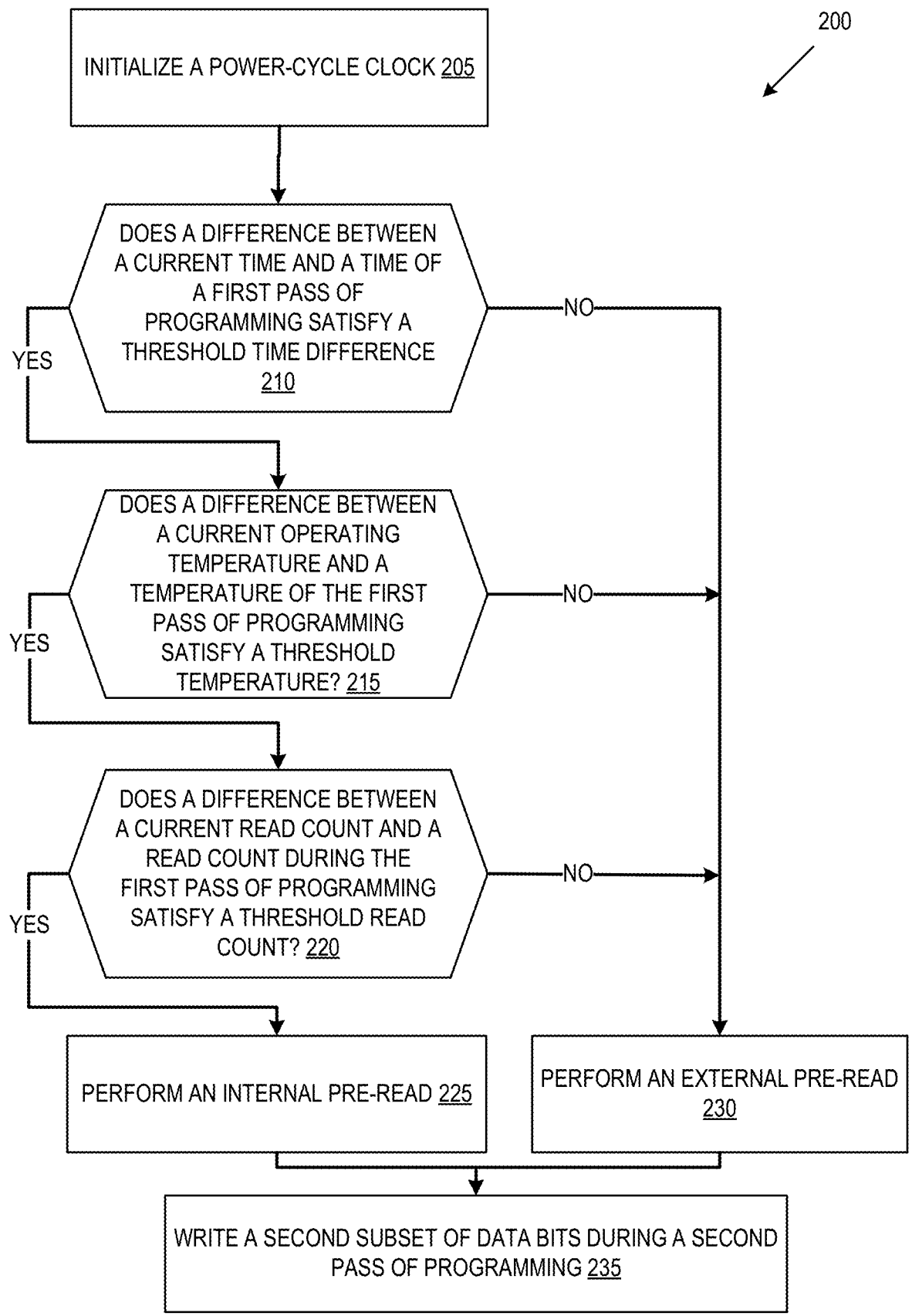
FIG. 2 illustrates an example of a process of performing adaptive pre-read selection in accordance with embodiments of the present disclosure.

FIG. 2 illustrates an example of a process of performing adaptive pre-read selection in accordance with embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the adaptive pre-read manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows, e.g., that include other parameters, are possible.

At operation 205, the adaptive pre-read manager 113 initializes a power-cycle clock. In some embodiments, the adaptive pre-read manager 113 starts a counter that measures the time elapsed from a power-on event. For example, the adaptive pre-read manager 113 stores a start time that represents a transition of the memory device 130 from a power-off to a power-on state of operation. In some embodiments, the adaptive pre-read manager 113 represents the power-cycle with an index that indicates the number of power-cycles that have occurred. For example, the power cycle index can differentiate the amount of time elapsed in one power cycle from a similar amount of time elapsed in another power cycle.

In some embodiments, a first set of data bits are received by the adaptive pre-read manager 113 for programming to memory. The adaptive pre-read manager 113 programs a first subset of data bits in a first pass of programming to memory. The adaptive pre-read manager 113 generates a time stamp indicating the time of the first pass of programming. During the first pass of programming, the adaptive pre-read manager 113 receives a plurality of operating conditions including a temperature.

At operation 210, the adaptive pre-read manager 113 determines if a time difference between a current system time and a time of a first pass of programming satisfies a threshold time difference. For example, the adaptive pre-read manager 113 computes a time difference between a current time and the time when the first pass of programming occurred and determines if that difference is less than or equal to the threshold time difference. If the adaptive pre-read manager 113 determines that the time difference satisfies the threshold time difference, the method 200 proceeds to operation 215. If the adaptive pre-read manager 113 determines that the time difference does not satisfy the threshold time difference, the method 200 proceeds to operation 230.

At operation 215, the adaptive pre-read manager 113 determines if a difference between a current operating temperature and a temperature during the first pass of programming satisfies a threshold temperature difference. For example, the adaptive pre-read manager 113 measures or is configured to receive an operating temperature of the memory device 130. The adaptive pre-read manager 113 computes a temperature difference between the current operating temperature and the temperature during the first pass of programming and determines if the temperature difference is less than or equal to the threshold temperature difference. If the adaptive pre-read manager 113 determines that the difference satisfies the threshold temperature difference, the method 200 proceeds to operation 220. If the adaptive pre-read manager 113 determines that the temperature difference does not satisfy the threshold temperature difference, the method 200 proceeds to operation 230.

At operation 220, the adaptive pre-read manager 113 determines if a difference between a current read count and a read count during the first pass of programming satisfies a threshold read count. For example, the adaptive pre-read manager 113 measures or is configured to receive a number of read operations performed on the memory device 130. The adaptive pre-read manager 113 determines if the difference between a number of read operations at the first pass of programming and the current number of read operations is less than or equal to a threshold number of read operations. If the adaptive pre-read manager 113 determines that the difference of the read count satisfies the threshold read count, the method 200 proceeds to operation 220. If the adaptive pre-read manager 113 determines that the difference of the read count does not satisfy the threshold read count, the method 200 proceeds to operation 230. While the method 200 is described above with reference to time, temperature, and read count, embodiments can use other parameters at each of operations 210, 215, and 220.

At operation 225, the adaptive pre-read manager 113 performs an internal pre-read of the first subset of data bits that were programmed to the memory device(s) 130 in the first pass of programming. For example, the adaptive pre-read manager 113 instructs the local media controller 135 to perform the internal pre-read to enable a second pass of programming using the first subset of data bits from the pre-read and a second subset of data bits. By performing the internal pre-read, the adaptive pre-read manager 113 leverages the existing limited error correction capability on the memory device 130 and reduces resources used to perform the pre-read. Because the internal pre-read is performed within the same memory device 130 (e.g., not a device external to the memory device 130), the workload of the memory subsystem controller 115 is reduced, enabling it to be used for other computing operations, and traffic on the interface between the memory subsystem controller 115 and the memory devices is reduced.

At operation 230, the adaptive pre-read manager 113 performs an external pre-read. For example, the adaptive pre-read manager 113 performs the pre-read by reading the first subset of data bits, which were programmed to the memory device(s) 130 in the first pass of programming, into the memory subsystem controller 115 (or otherwise external to the memory device 130), e.g., to error correct the first subset of data bits using an LDPC decoder, or other decoder with greater error correction capabilities than the local media controller 135 (e.g., external to the memory device 130). By performing the external pre-read, the adaptive pre-read manager 113 achieves an improved error correction capability at a cost of use of additional resources such as a decoder and bus or other memory interface (e.g., open NAND flash interface (ONFI)).

In some embodiments, the adaptive pre-read manager 113 determines if an index of the power-cycle has changed, indicating that the method 200 is on a different power-cycle. For example, during a single power cycle (e.g., the index of the power cycle has not changed), multiple pre-reads may occur. The pre-reads may occur as a result of receiving sets of data bits for writing to memory. In memory devices with long duty cycles that have few power cycles, if a change in the power-cycle index is detected, an external pre-read can be set as a default setting. In some embodiments, the comparison of the operating conditions described above occur within the same power-cycle. After an additional power-cycle has been initialized and the index of the power-cycle has increased, a power-off time extrapolation can be performed using a shift in the threshold voltage.

At operation 235, the adaptive pre-read manager 113 writes the second subset of data bits during a second pass of programming. For instance, the second subset of data bits are the data bits of the first set of data bits that were not programmed to the memory block during the first pass of programming. The adaptive pre-read manager 113 initially writes the second subset of data bits to a different memory location than the memory block, such as a buffer or a non-volatile memory location. After performing the comparison of operating conditions to respective thresholds and performing the pre-read, the adaptive pre-read manager 113 performs the second pass of programming using the first subset of data bits from the pre-read to write the second subset of data bits to the memory block. For example, the adaptive pre-read manager 113 increases the bit density of the memory cells during the second pass of programming. The second pass of programming, therefore, includes applying programming voltages to update the values stored in the first pass of programming (e.g., a threshold voltage of each cell representing three bits) to values aligned with the full write (e.g., a threshold voltage of each cell representing four bits).

Figure 3:
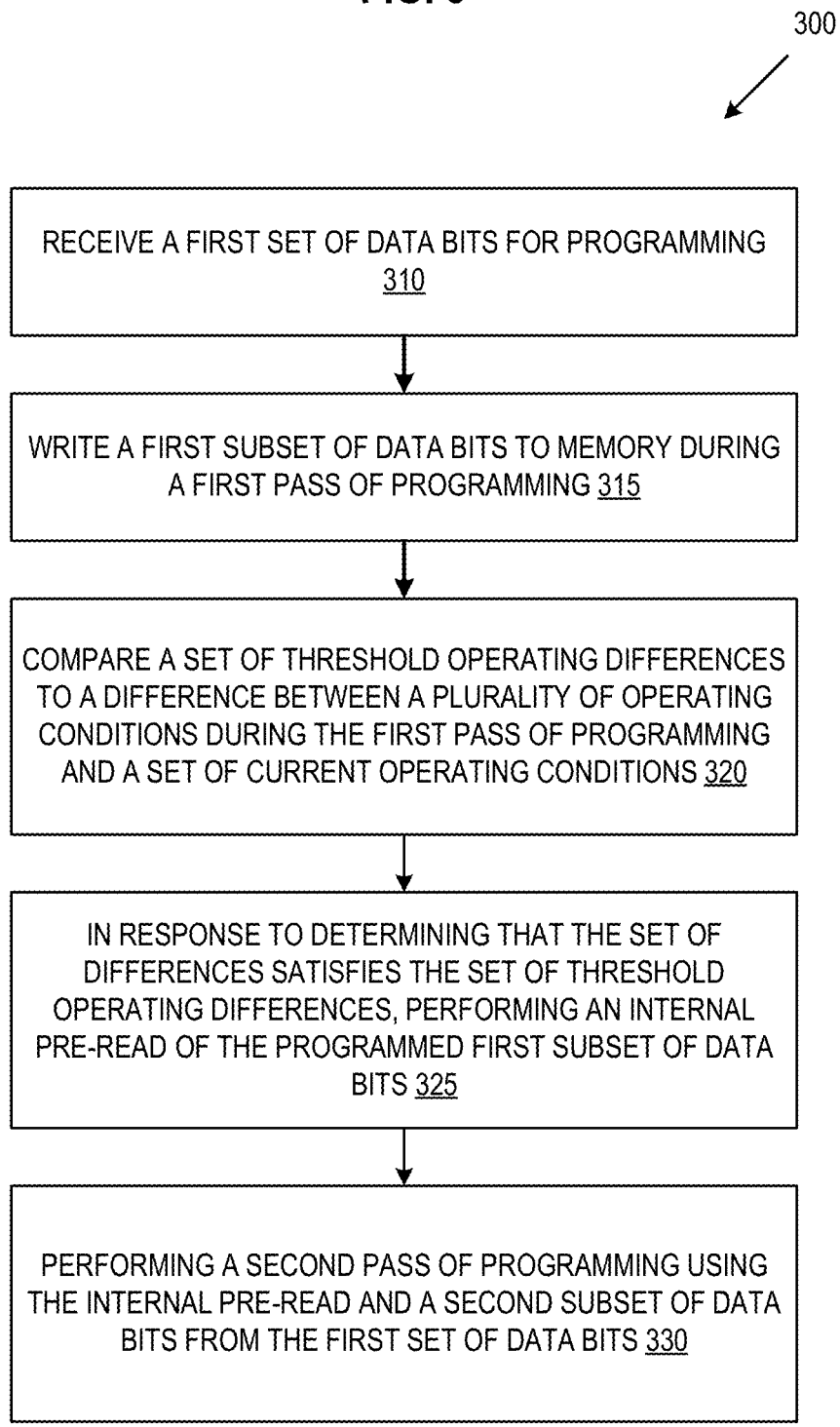
FIG. 3 is a flow diagram of an example method to select an internal pre-read or an external pre-read of data bits written to memory in accordance with some embodiments of the present disclosure.

FIG. 3 is a flow diagram of an example method to select an internal pre-read or an external pre-read of data bits written to memory in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the adaptive pre-read manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the adaptive pre-read manager 113 receives a first set of data bits for programming to memory. The adaptive pre-read manager 113 is configured to receive sets of data bits for programming to the memory devices. In some embodiments, the adaptive pre-read manager 113 receives four pages of data for writing to a word line. In other embodiments, the programming manager receives any number of data bits that can be programmed to memory by the memory subsystem. For example, in two-pass programming, the first pass can include coarse data programming (i.e., leaving the data in an unreadable state) and the second pass can include fine data programming (i.e., leaving the data in a readable state). Alternatively, the first pass includes programming only part of the data in a readable state and the second pass includes programming the remainder in a readable state.

At operation 315, the adaptive pre-read manager 113 writes a first subset of data bits to a memory block during a first pass of programming. From the first set of data bits received at operation 310, the adaptive pre-read manager 113 selects a first subset of data bits for writing to the memory block and a second subset of data bits to write to a buffer location. For example, the adaptive pre-read manager 113 can program a first subset of the data in a readable 8 Vt state in the first pass, buffering a remainder of the data (e.g., the second subset), and program the remainder of data in the second pass of programming, increasing the programmed memory to a greater bit density for a readable 16 Vt state. This "8-16" two-pass programming, however, can increase the cell-to-cell coupling and/or other stress conditions that can cause pre-read errors. This cell-to-cell coupling is mitigated by monitoring the operating conditions by the adaptive pre-read manager 113. In some embodiments, the adaptive pre-read manager 113 measures a plurality of operating conditions during the first pass of programming.

At operation 320, the adaptive pre-read manager 113 compares a plurality of operating conditions to a set of threshold operating conditions. As described above regarding operations 210, 215, and 220, the various operating conditions are compared to respective thresholds for each operating condition.

At operation 325, the adaptive pre-read manager 113 selects an internal pre-read or an external pre-read using the comparison of the plurality of operating conditions to the set of threshold operating conditions. As described above regarding operation 225 or operation 230, the adaptive pre-read manager 113 selects a type of pre-read depending on the outcomes of the comparisons of operating conditions to each threshold operating condition. For example, if each of the operating conditions satisfy a corresponding threshold operating condition, the adaptive pre-read manager 113 selects an internal pre-read. In another example, if one or more of the operating conditions do not satisfy a corresponding threshold operating condition, the adaptive pre-read manager 113 selects an external pre-read.

At operation 330, the adaptive pre-read manager 113 performs a second pass of programming using the internal pre-read and the second subset of data bits from the first set of data bits. During the second pass of programming, the adaptive pre-read manager 113 writes the second subset of data bits, which were programmed to the buffer location, to the memory block during the first pass of programming. For example, the adaptive pre-read manager 113 performs a second pass of programming using the internal pre-read and the second subset of data bits as described with reference to operation 235 above. While the example illustrated in FIG. 3 and described above includes performing an internal pre-read with regard to the second pass of programming, in some embodiments, the adaptive pre-read manager 113 can perform an internal pre-read of the block prior to performing the first pass of programming.

Figure 4:
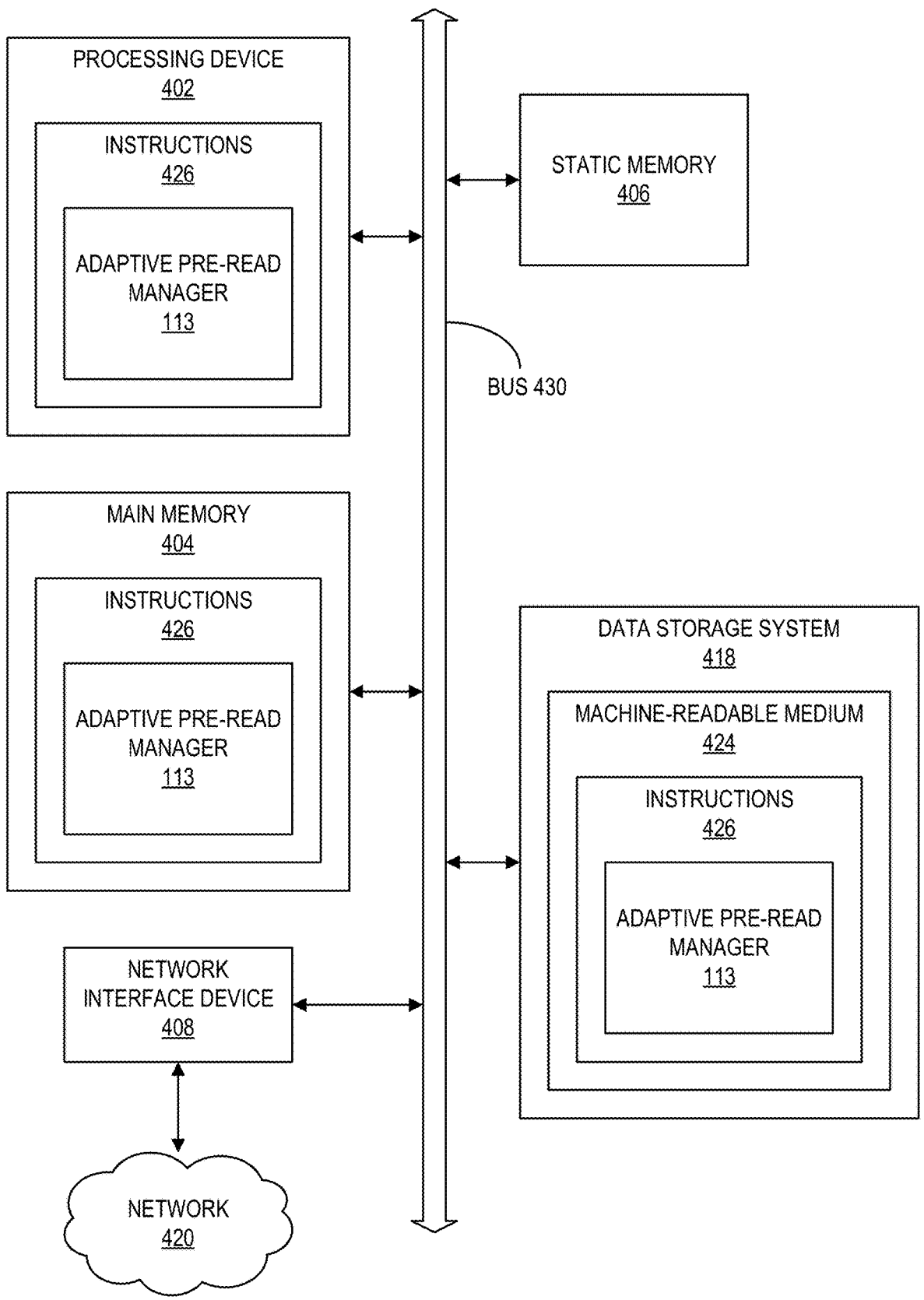
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the adaptive pre-read manager 113 of FIG. 1). In alternative embodiments, the machine can be connected (e.g., networked) to other machines in a LAN, an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) which is stored on one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory subsystem 110 of FIG. 1.

In one embodiment, the instructions 426 include instructions to implement functionality corresponding to an adaptive pre-read manager (e.g., the adaptive pre-read manager 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that can cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200, 300, or 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method of adaptive pre-read management, the method comprising:

receiving a first set of data bits for programming to memory;

performing, at a first time, a first pass of programming including a first subset of data bits from the first set of data bits;

comparing, at a second time after the first time, a first threshold operating difference to a first difference between a temperature condition obtained at the first time and a temperature condition obtained at the second time;

in response to determining that the first difference satisfies the first threshold operating difference, comparing, at the second time after the first time, a second threshold operating difference to a second difference between a number of memory access commands obtained at the first time and a number of memory access commands obtained at the second time;

in response to determining that the second difference satisfies the second threshold operating difference, performing an internal pre-read of the programmed first subset of data bits; and performing a second pass of programming based on the internal pre-read and a second subset of data bits from the first set of data bits.

2. The method of claim 1, further comprising:

in response to determining that the second difference satisfies the second threshold operating difference, comparing, at the second time after the first time, a third threshold operating difference to a threshold time difference between the first time and the second time.

3. The method of claim 1, further comprising:

receiving a second set of data bits for programming to the memory;

performing, at a third time after the second time, a first pass of programming of the second set of data bits, the first pass of programming including a third subset of data bits from the second set of data bits;

comparing, at a fourth time after the third time, a threshold time difference to a time interval between the third time and the fourth time;

in response to determining that the time interval does not satisfy the threshold time difference, performing an external pre-read of the programmed third subset of data bits; and performing a second pass of programming using the external pre-read and a fourth subset of data bits from the second set of data bits.

4. The method of claim 1, further comprising:

receiving a second set of data bits for programming to the memory;

performing, at a third time after the second time, a first pass of programming of the second set of data bits, the first pass of programming including a third subset of data bits from the second set of data bits;

comparing, at a fourth time after the third time, the first threshold operating difference to a third difference between a temperature obtained at the third time and a temperature obtained at the fourth time;

in response to determining that the third difference does not satisfy the first threshold operating difference, performing an external pre-read of the programmed third subset of data bits; and performing a second pass of programming using the external pre-read and a fourth subset of data bits from the second set of data bits.

5. The method of claim 4, wherein the external pre-read is performed by an LDPC decoder of a media subsystem controller.

6. The method of claim 1, wherein the internal pre-read is performed by a local media controller of the memory.

7. The method of claim 1, further comprising:

receiving a second set of data bits for programming to the memory;

performing, at a third time after the second time, a first pass of programming of the second set of data bits, the first pass of programming including a third subset of data bits from the second set of data bits;

comparing, at a fourth time after the third time, the second threshold operating difference to a fourth difference between a first number of memory access commands obtained at the third time and a first number of memory access commands obtained at the fourth time;

in response to determining that the fourth difference does not satisfy the second threshold operating difference, performing an external pre-read of the programmed third subset of data bits; and performing a second pass of programming using the external pre-read and a fourth subset of data bits from the second set of data bits.

8. A non-transitory computer-readable storage medium comprising instructions that, when executed by a processing device, causes the processing device to:

receive a first set of data bits for programming to memory;

perform, at a first time, a first pass of programming including a first subset of data bits from the first set of data bits;

compare, at a second time after the first time, a threshold time difference to a time interval between the first time and the second time;

compare, at the second time after the first time, a threshold read count difference to a read count difference between a number of memory access commands obtained at the first time and a number of memory access commands at the second time;

in response to determining that the time interval satisfies the threshold time difference and the read count difference satisfies the threshold read count difference, perform an internal pre-read of the programmed first subset of data bits; and perform a second pass of programming using the internal pre-read and a second subset of data bits from the first set of data bits.

9. The non-transitory computer-readable storage medium of claim 8, the processing device further caused to compare a threshold temperature difference to a temperature difference between a temperature obtained at the first time and a temperature obtained at the second time.

10. The non-transitory computer-readable storage medium of claim 8, the instructions further causing the processing device to:

receive a second set of data bits for programming to the memory;

perform, at a third time after the second time, a first pass of programming of the second set of data bits, the first pass of programming including a third subset of data bits from the second set of data bits;

compare, at a fourth time after the third time, the threshold time difference to a second time interval between the third time and the fourth time;

in response to determining that the second time interval does not satisfy the threshold time difference, perform an external pre-read of the programmed third subset of data bits; and perform a second pass of programming using the external pre-read and a fourth subset of data bits from the second set of data bits.

11. The non-transitory computer-readable storage medium of claim 8, further comprising instructions that, when executed by a processing device, cause the processing device to:

receive a second set of data bits for programming to the memory;

perform, at a third time after the second time, a first pass of programming of the second set of data bits, the first pass of programming including a third subset of data bits from the second set of data bits;

compare, at a fourth time after the third time, the threshold read count difference to a second read count difference between a number of memory access commands obtained at the third time and a number of memory access commands obtained at the fourth time;

in response to determining that the second read count difference does not satisfy the threshold read count difference, perform an external pre-read of the programmed third subset of data bits; and perform a second pass of programming using the external pre-read and a fourth subset of data bits from the second set of data bits.

12. The non-transitory computer-readable storage medium of claim 8, further comprising instructions that, when executed by a processing device, cause the processing device to:

receive a second set of data bits for programming to the memory;

perform, at a third time after the second time, a first pass of programming of the second set of data bits, the first pass of programming including a third subset of data bits from the second set of data bits;
compare, at a fourth time after the third time, a threshold temperature difference to temperature difference between a first temperature obtained at the third time and a second temperature obtained at the fourth time;
further in response to determining that the temperature difference does not satisfy the threshold temperature difference, perform an external pre-read of the programmed third subset of data bits; and
perform a second pass of programming using the external pre-read and a fourth subset of data bits from the second set of data bits.

13. The non-transitory computer-readable storage medium of claim 12, wherein the external pre-read is performed by an LDPC decoder of a media subsystem controller.

14. The non-transitory computer-readable storage medium of claim 8, wherein the internal pre-read is performed by a local media controller of the memory.

15. A system comprising:
a plurality of memory devices; and
a processing device, operatively coupled with the plurality of memory devices, to:
receive a first set of data bits for programming to a memory;
write, at a first time, a first subset of data bits to the memory;
compare, at a second time after the first time, a threshold time difference to a time interval between the first time and the second time;
compare, at the second time after the first time, a threshold read count difference to a read count difference between a number of memory access commands obtained at the first time and a number of memory access commands obtained at the second time; and
select an internal pre-read or an external pre-read using the comparison of the time interval and the read count difference to respective threshold differences.

16. The system of claim 15, the processing device is operatively coupled further to compare a threshold temperature difference to a temperature difference between a temperature obtained at the first time and a temperature obtained at the second time.

17. The system of claim 16, the processing device is operatively coupled further to:
receiving a second set of data bits for programming to the memory;
perform, at a third time after the second time, a first pass of programming of the second set of data bits, the first pass of programming including a third subset of data bits from the second set of data bits;
compare, at a fourth time after the third time, the threshold time difference to a second time interval between the third time and the fourth time;
in response to determining that the second time interval does not satisfy the threshold time difference, perform an external pre-read of the programmed third subset of data bits; and
perform a second pass of programming using the external pre-read and a fourth subset of data bits from the second set of data bits.

18. The system of claim 15, the processing device is operatively coupled further to:
receive a second set of data bits for programming to memory;
perform, at a third time after the second time, a first pass of programming of the second set of data bits, the first pass of programming including a third subset of data bits from the second set of data bits;
compare, at a fourth time after the third time, a threshold temperature difference to a temperature difference between the third time and the fourth time;
compare, at the fourth time after the third time, the threshold read count difference a second read count difference between a number of memory access commands obtained at the third time and a number of memory access commands obtained at the fourth time;
further in response to determining that the temperature difference or the second read count difference do not satisfy the threshold temperature difference or the threshold read count difference, respectively, perform the external pre-read of the programmed third subset of data bits; and
performing a second pass of programming using the external pre-read and a fourth subset of data bits from the second set of data bits.

19. The system of claim 15, wherein the internal pre-read is performed by a local media controller of the memory.

20. The system of claim 15, wherein the external pre-read is performed by an LDPC decoder of a media subsystem controller.

* * * * *